United States Patent
Kosai et al.

(10) Patent No.: US 11,862,486 B2
(45) Date of Patent: Jan. 2, 2024

(54) SUBSTRATE LIQUID PROCESSING APPARATUS, SUBSTRATE LIQUID PROCESSING METHOD AND RECORDING MEDIUM

(71) Applicant: Tokyo Electron Limited, Tokyo (JP)

(72) Inventors: Kazuki Kosai, Koshi (JP); Yoshihiro Kai, Koshi (JP); Gentaro Goshi, Koshi (JP); Hiroshi Komiya, Koshi (JP); Seiya Fujimoto, Koshi (JP); Takahisa Otsuka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 723 days.

(21) Appl. No.: 16/985,424

(22) Filed: Aug. 5, 2020

(65) Prior Publication Data

US 2020/0365424 A1 Nov. 19, 2020

Related U.S. Application Data (62) Division of application No. 15/777,941, filed as application No. PCT/JP2016/084104 on Nov. 17, 2016, now Pat. No. 10,770,316.

(30) Foreign Application Priority Data

Nov. 24, 2015 (JP) ................................ 2015-228833

(51) Int. Cl.
*H01L 21/67* (2006.01)
*B08B 3/02* (2006.01)
(Continued)

(52) U.S. Cl.
CPC .......... *H01L 21/6708* (2013.01); *B08B 3/024* (2013.01); *B08B 3/041* (2013.01);
(Continued)

(58) Field of Classification Search
None
See application file for complete search history.

(56) References Cited

U.S. PATENT DOCUMENTS 9,162,247 B2 * 10/2015 Yoshihara .............. B05D 1/005
2007/0234951 A1 10/2007 Lu et al.
(Continued)

FOREIGN PATENT DOCUMENTS

JP 61160930 A * 7/1986 ............ H01L 21/30
JP S61-160930 A 7/1986
(Continued)

OTHER PUBLICATIONS

International Search Report for PCT/JP2016/084104 dated Jan. 24, 2017.

*Primary Examiner* — Sylvia MacArthur
(74) *Attorney, Agent, or Firm* — Pearne & Gordon LLP (57) ABSTRACT

A substrate processing apparatus includes a substrate holding unit 31 configured to hold a substrate W; an outer nozzle 45 configured to discharge a processing liquid toward a surface of the substrate from a position at an outside of an outer edge of the substrate held by the substrate holding unit such that at least a central portion of the surface of the substrate is covered with a liquid film of the discharged processing liquid; and an actuator 46 (90) configured to change a height position or a discharge angle of the outer nozzle.

5 Claims, 4 Drawing Sheets

(51) Int. Cl.
*H01L 21/3213* (2006.01)
*H01L 21/306* (2006.01)
*B08B 3/04* (2006.01)
*B08B 3/08* (2006.01)
*H01L 21/02* (2006.01)
*H01L 21/687* (2006.01)

(52) U.S. Cl.
CPC .......... *B08B 3/08* (2013.01); *H01L 21/02057* (2013.01); *H01L 21/30604* (2013.01); *H01L 21/30608* (2013.01); *H01L 21/32134* (2013.01); *H01L 21/6715* (2013.01); *H01L 21/67051* (2013.01); *H01L 21/67253* (2013.01); *H01L 21/68764* (2013.01)

(56) References Cited

U.S. PATENT DOCUMENTS

| | | | |
|---|---|---|---|
| 2012/0097097 A1* | 4/2012 | Ikushima | B05C 5/0216 |
| | | | 118/300 |
| 2013/0199726 A1 | 8/2013 | Kim et al. | |
| 2013/0255728 A1 | 10/2013 | Noh | |
| 2014/0197129 A1* | 7/2014 | Fujii | H01L 21/30608 |
| | | | 216/2 |
| 2020/0365424 A1* | 11/2020 | Kosai | H01L 21/6715 |

FOREIGN PATENT DOCUMENTS

| | | |
|---|---|---|
| JP | 2003-203892 A | 7/2003 |
| JP | 2007-266630 A | 10/2007 |
| JP | 2013021183 A | 1/2013 |
| JP | 2015-177027 A | 10/2015 |
| JP | 2015-201627 A | 11/2015 |
| KR | 100987795 B1 | 10/2010 |

\* cited by examiner

SUBSTRATE LIQUID PROCESSING APPARATUS, SUBSTRATE LIQUID PROCESSING METHOD AND RECORDING MEDIUM

CROSS-REFERENCE TO RELATED APPLICATION

This is a divisional application of U.S. patent application Ser. No. 15/777,941, filed on May 22, 2018, which is a U.S. national phase application under 35 U.S.C. § 371 of PCT Application No. PCT/JP2016/084104 filed on Nov. 17, 2016, which claims the benefit of Japanese Patent Application No. 2015-228833 filed on Nov. 24, 2015, the entire disclosures of which are incorporated herein by reference.

TECHNICAL FIELD

The various embodiments described herein pertain generally to a technique of performing a liquid processing on a substrate such as a semiconductor wafer by supplying a processing liquid onto the substrate.

BACKGROUND ART

In a manufacturing process of a semiconductor device, a liquid processing such as wet etching or chemical liquid cleaning is performed on a substrate such as a semiconductor wafer by supplying a processing liquid onto a surface of the substrate while rotating the substrate around a vertical axis. Though the supply of the processing liquid onto the substrate is generally performed by a movable nozzle held by a nozzle arm, it may be performed by an outer nozzle provided at an outside of an outer edge of the substrate (see, for example, Patent Document 1).

The outer nozzle is used to supply the processing liquid to a central portion of the substrate to suppress the central portion of the substrate being rotated from being dried when the movable nozzle is unable to supply the required processing liquid onto the central portion of the substrate. The outer nozzle is immovably fixed to the outside of the outer edge of the substrate. Therefore, an arrival position of the processing liquid discharged from the outer nozzle is entirely determined based on a discharge flow rate of the processing liquid (force of the liquid). For the purposes of suppressing the substrate from being dried, the processing liquid discharged from the outer nozzle is required to cover the central portion of the substrate. For this reason, the flow rate of the processing liquid supplied onto the substrate from the outer nozzle cannot be changed flexibly as required.

PRIOR ART DOCUMENT

Patent Document 1: Japanese Patent Laid-open Publication No. 2013-021183

DISCLOSURE OF THE INVENTION

In view of the foregoing, exemplary embodiments provide an outer nozzle capable of changing a discharge flow rate flexibly as required.

In one exemplary embodiment, a substrate liquid processing apparatus includes a substrate holding unit configured to hold a substrate; an outer nozzle configured to discharge a processing liquid toward a surface of the substrate from a position at an outside of an outer edge of the substrate held by the substrate holding unit such that at least a central portion of the surface of the substrate is covered with a liquid film of the discharged processing liquid; and an actuator configured to change a height position or a discharge angle of the outer nozzle.

In another exemplary embodiment, a substrate liquid processing method includes discharging a processing liquid toward a surface of a substrate from an outer nozzle provided at a position at an outside of an outer edge of the substrate; and adjusting a height position or a discharge angle of the outer nozzle by using an actuator such that the processing liquid discharged from the outer nozzle arrives at a target arrival position on the substrate.

In still another exemplary embodiment, there is provided a computer-readable recording medium having stored thereon computer-executable instructions that, in response to execution, cause a substrate liquid processing apparatus to perform the substrate liquid processing method.

According to the exemplary embodiments, it is possible to change a discharge flow rate of the processing liquid from the outer nozzle flexibly by changing the height position or the discharge angle of the outer nozzle by the actuator.

DETAILED DESCRIPTION

Figure 1:
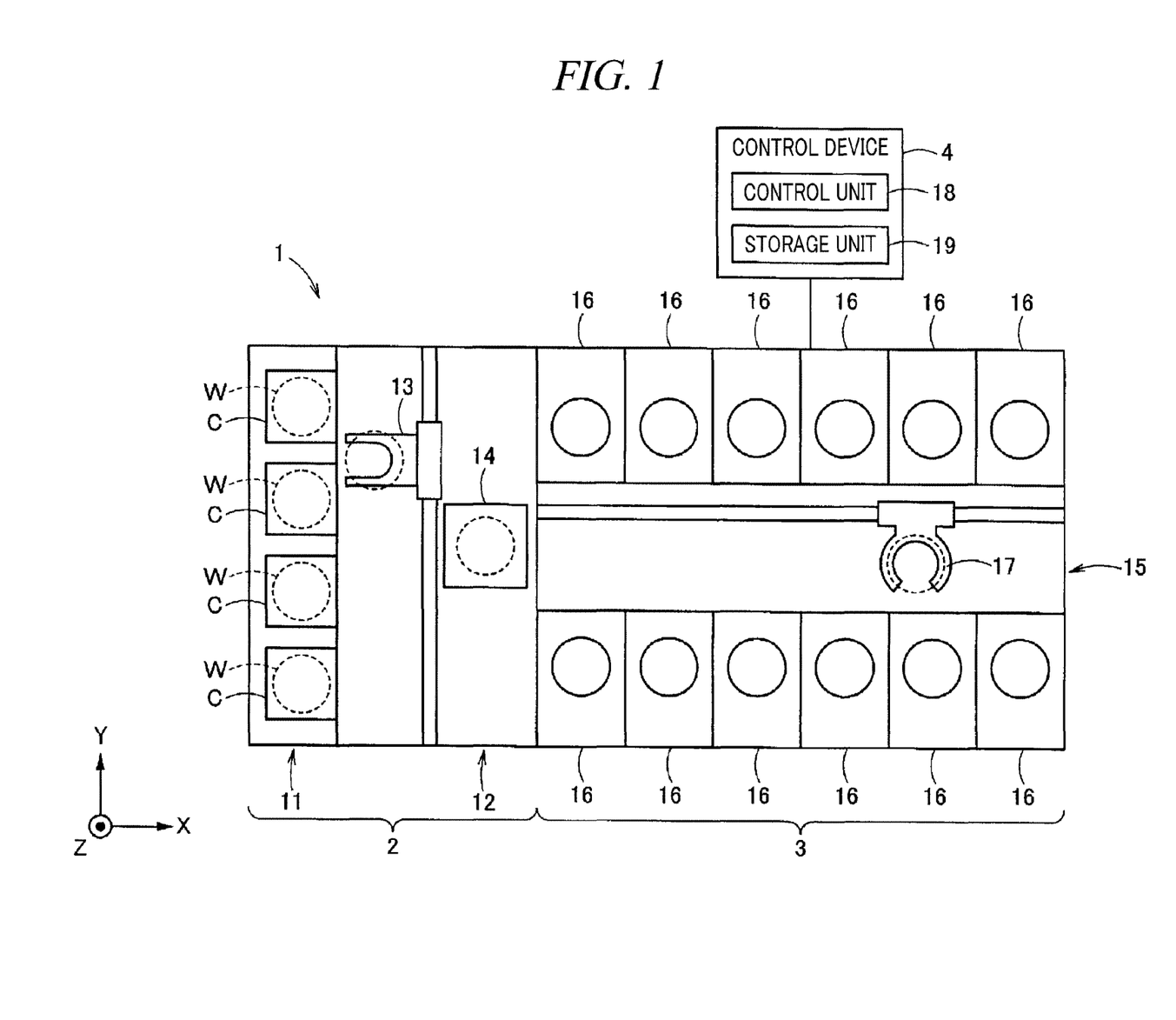
FIG. 1 is a plan view illustrating an outline of a substrate processing system according to an exemplary embodiment.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Now, referring to FIG. 2 and FIG. 3, a configuration of the processing unit 16 will be discussed. The processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 configured to form a downflow within the chamber 20 is provided on the ceiling of the chamber 20.

The substrate holding mechanism 30 is provided with a substrate holding unit 31, a shaft unit 32, and a rotational driving unit 33. The substrate holding unit 31 is configured to hold the wafer W horizontally. As the rotational driving unit 33 rotates the substrate holding unit 31 via the shaft unit 32, the wafer W held by the substrate holding unit 31 is rotated around the vertical axis.

The processing fluid supply unit 40 is equipped with a multiple number of movable nozzles 41 each configured to supply a processing fluid (a processing liquid or a processing gas) onto the wafer W. In the present exemplary embodiment, the multiple number of nozzles 41 include a first nozzle 41a, a drying gas nozzle 41b, a second nozzle 41c and a solvent nozzle 41d. Besides these nozzles, the multiple number of nozzles 41 may further include another nozzle for supplying a processing fluid.

Figure 2:
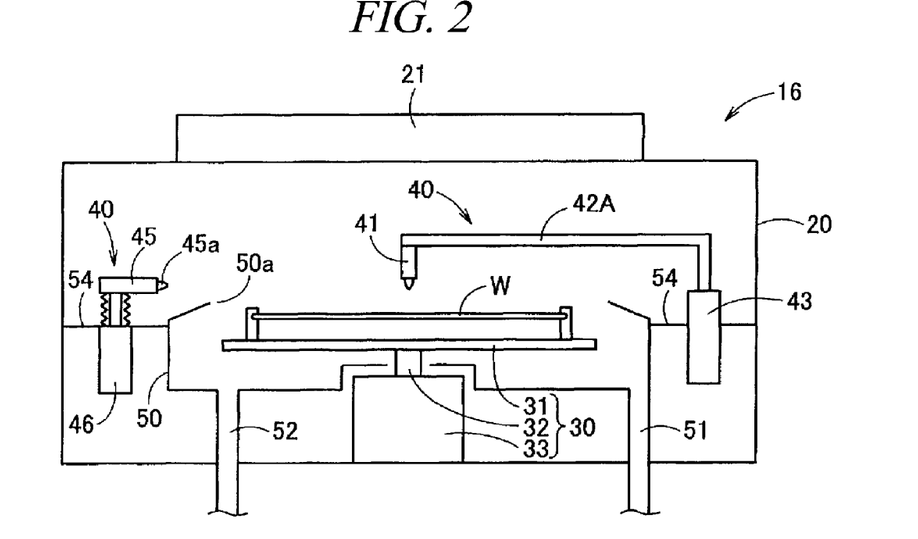
FIG. 2 is a longitudinal cross sectional view schematically illustrating a configuration of a processing unit.
Figure 3:
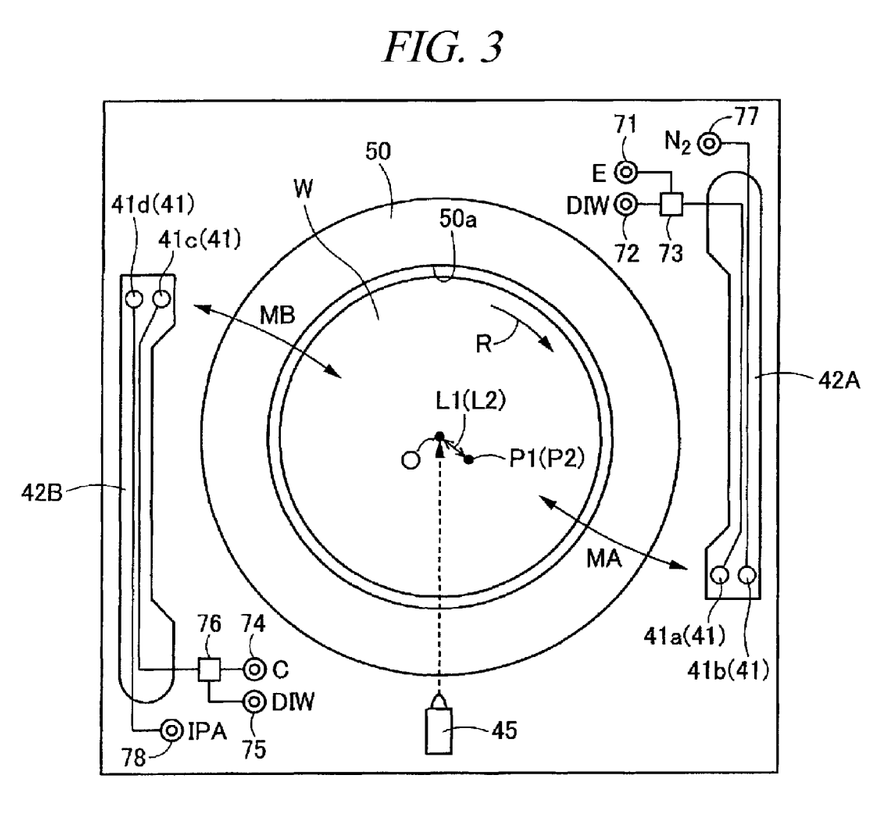
FIG. 3 is a plan view schematically illustrating the configuration of the processing unit.

To elaborate, as shown in FIG. 3, the processing fluid supply unit 40 is equipped with a first nozzle arm 42A and a second nozzle arm 42B. For the simplicity of illustration, only one nozzle arm 42A between the two nozzle arms 42A and 42B is shown in FIG. 2. The first nozzle 41a and the drying gas nozzle 41b are provided at the first nozzle arm 42A, and the second nozzle 41c and the solvent nozzle 41d are provided at the second nozzle arm 42B. The first nozzle 41a and the second nozzle 41c are respectively provided at the first nozzle arm 42A and the second nozzle arm 42B to discharge a liquid directly downwards.

Each of the nozzle arms 42A and 42B is configured to be pivotable around the vertical axis (as indicated by arrows MA and MB in FIG. 3) and vertically movable by an arm driving unit 43 shown in FIG. 2. By rotating the nozzle arms 42A and 42B, the nozzles 41 (41a to 41d) provided at the nozzle arms 42A and 42B can be located at positions between a position directly above a center O of the wafer W and standby positions (as shown in FIG. 3) at an outside of the recovery cup 50 when viewed from the top.

As depicted in FIG. 3, the first nozzle 41a is connected with an etching liquid supply unit (chemical liquid supply unit) 71 and a first rinse liquid supply unit 72. By switching a switching valve device 73, either an etching liquid (e.g., nitrohydrofluoric acid) or a rinse liquid (e.g., DIW (Deionized Water), i.e., pure water) is selectively supplied from the first nozzle 41a. Further, the second nozzle 41c is connected with a cleaning liquid supply unit (chemical liquid supply unit) 74 and a second rinse liquid supply unit 75. By switching a switching valve device 76, either a cleaning liquid (e.g., SC-1) or a rinse liquid (e.g., pure water) is selectively supplied from the second nozzle 41c. Each of the switching valve devices 73 and 76 may be implemented by a single three-way valve or two opening/closing valves.

The drying gas nozzle 41b is connected with a nitrogen gas supply unit 77, and the solvent nozzle 41d is connected with an IPA (isopropyl alcohol) supply unit 78.

Though not illustrated, each of the processing fluid supply units 71, 72, 74, 75, 77 and 78 is equipped with: a processing fluid supply source composed of a tank, a cylinder and a factory power supply source; a pipeline connecting the processing fluid supply source and the corresponding nozzle 41 (41a to 41d); and a flow control device such as an opening/closing valve and a flow rate control valve provided at the corresponding pipeline.

Particularly, as illustrated in FIG. 2, the recovery cup 50 is disposed to surround the substrate holding unit 31, and collects the liquid scattered from the wafer W after being supplied from the nozzle 41 onto the wafer W being rotated. A drain port 51 is formed on the bottom of the recovery cup 50, and the processing liquid collected by the recovery cup 50 is drained from the drain port 51 to the outside of the processing unit 16. Further, an exhaust port 52 is formed on the bottom of the recovery cup 50 to discharge an atmosphere within the recovery cup 50 to the outside of the chamber 20 (processing unit 16).

The processing fluid supply unit 40 is also equipped with an outer nozzle 45. When viewed from the top (that is, in FIG. 3), a discharge opening 45a of the outer nozzle 45 is located at least at an outside of an outer edge of the wafer W held by the substrate holding unit 31. In the shown example, the discharge opening 45a of the outer nozzle 45 is located at an outside of an inner edge 50a of an upper end opening of the recovery cup 50, when viewed from the top.

Figure 4:
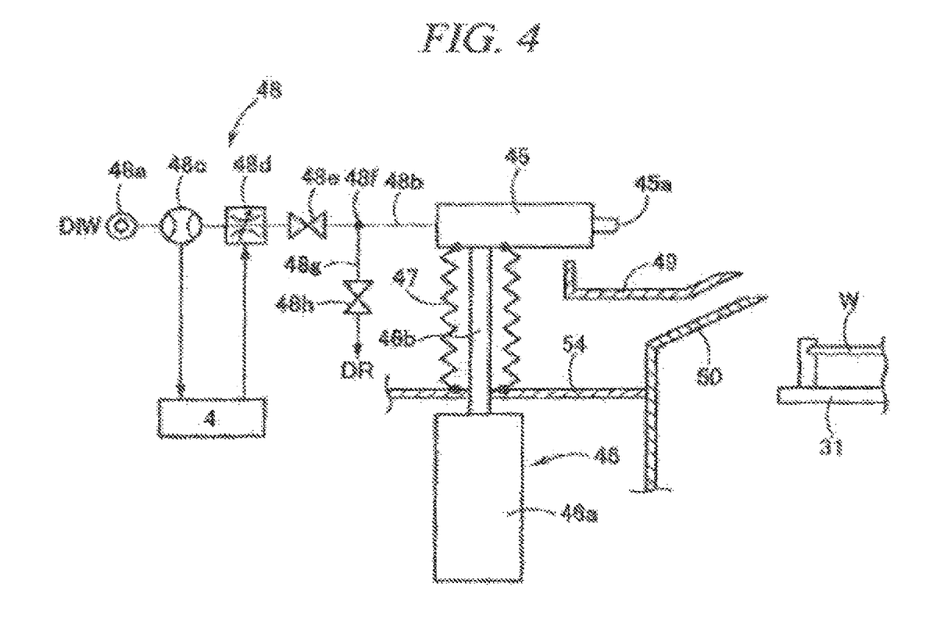
FIG. 4 is a schematic diagram illustrating a configuration of an outer nozzle and a processing liquid supply mechanism and an elevating mechanism corresponding thereto.

Particularly, as depicted in FIG. 4, the outer nozzle 45 is configured to be movable up and down by an elevating mechanism 46. Though not illustrated in detail, the elevating mechanism 46 may be implemented by, by way of non-limiting example, a linear actuator which is equipped with an electric rotating motor and a ball screw having a screw shaft rotated by the electric rotating motor. A bellows 47 is disposed to surround a movable portion of the elevating mechanism 46 such that the elevating mechanism 46 is not exposed to the atmosphere of the processing liquid. In the present exemplary embodiment, the outer nozzle 45 is not movable horizontally (in the X and Y directions) but movable only vertically (in the Z direction). That is, the outer nozzle 45 is provided such that a relative position thereof with respect to the wafer W is not changed when viewed from the top. If a continuous control over a height position of the outer nozzle 45 is not required, a multi-position air cylinder may be used as the linear actuator.

In an example shown in FIG. 4, an upper end of the bellows 47 is in firm contact with a bottom surface of the outer nozzle 45, and a lower end of the bellows 47 is in firm contact with a top surface of a bottom plate (partition plate) 54 surrounding the recovery cup 50. A main body portion 46a of the elevating mechanism 46 is placed under the bottom plate 54. An elevating rod 46b configured to be moved up and down by being driven through the main body portion 46a of the elevating mechanism 46 is extended through a hole 54a formed at the bottom plate 54 and surrounded by the bellows 47.

DIW as the rinse liquid is supplied to the outer nozzle 45 from a rinse liquid supply unit 48. The rinse liquid supply unit 48 is equipped with a rinse liquid supply line (passageway) 48b; and a flowmeter 48c, a flow rate control valve 48d and an opening/closing valve 48e provided at the rinse liquid supply line 48b in sequence from the upstream side. One end of this rinse liquid supply line 48b is connected to a rinse liquid supply source 48a such as a tank, and the other end thereof is connected to the outer nozzle 45. A drain line 48g is branched from the rinse liquid supply line 48b at a branch point 48f at a downstream of the opening/closing valve 48e. The drain line 48g is provided with an opening/closing valve 48h. A height position of a downstream end of the drain line 48g is lower than the outer nozzle 45.

It is desirable to provide a liquid-receiving member 49 under the outer nozzle 45. The liquid-receiving member 49 receives the rinse liquid discharged from the outer nozzle 45 (but not reaching the wafer W) immediately after the discharge of the rinse liquid from the outer nozzle 45 is begun (that is, immediately after the opening/closing valve 48e is opened) and immediately before the discharge of the rinse liquid from the outer nozzle 45 is completely stopped (that is, immediately after the opening/closing valve 48e is closed). Further, the liquid-receiving member 49 also receives the liquid (rinse liquid) falling down from the outer nozzle 45 after the opening/closing valve 48e is closed. The rinse liquid received by the liquid-receiving member 49 is drained through a non-illustrated drain line to the outside of the processing unit 16. The liquid-receiving member 49 may be fixed to the recovery cup 50 or the bottom plate 54. The liquid-receiving member 49 may be connected to the outer nozzle 45 to be moved up and down along with the outer nozzle 45.

The rinse liquid is supplied from the outer nozzle 45 onto a surface (a device formation surface facing upwards) of the wafer W held by the substrate holding unit 31. The outer nozzle 45 is provided such that rinse liquid discharged from the outer nozzle 45 flies on a straight line connecting the discharge opening 45a of the outer nozzle 45 and the center O of the wafer W, when viewed from the top. An arrival position (arrival point) of the rinse liquid arriving at the surface of the wafer W after being discharged from the outer nozzle 45 is determined based on a discharge flow rate (a flow rate per unit time) of the rinse liquid from the outer nozzle 45, the height position of the outer nozzle 45 and a discharge angle (ascending angle or descending angle) of the outer nozzle 45. In the present exemplary embodiment, since there is provided no actuator configured to change the discharge angle of the outer nozzle 45, the aforementioned arrival position is determined based on the discharge flow rate of the rinse liquid from the outer nozzle 45 and the height position of the outer nozzle 45. Further, the discharge angle of the outer nozzle 45 may be manually adjusted at the time of initial setting or maintenance.

When the rinse liquid is discharged from the outer nozzle 45, the control device 4 feedback-controls the opening degree of the flow rate control valve 48d based on a detection value of the flowmeter 48c in order to obtain the discharge flow rate defined in a process recipe.

In order to allow the rinse liquid reaching the surface of the wafer W being rotated after being discharged from the outer nozzle 45 to be uniformly diffused on the entire surface of the wafer W, it is desirable that the rinse liquid arrives at the center O of the wafer W. To allow the rinse liquid to arrive at the center O of the wafer W regardless of the discharge flow rate of the rinse liquid, the height position of the outer nozzle 45 is adjusted by the elevating mechanism 46. The height of the outer nozzle 45 at which the rinse liquid is allowed to reach the center O of the wafer W may be calculated for individual discharge flow rates of the rinse liquid in advance through experiment (or simulation). A combination of the discharge flow rate of the rinse liquid and the height position of the outer nozzle 45 determined based on this experiment result is set as a process parameter, which is recorded in the process recipe. For example, the process recipe may be stored in the storage unit 19 of the control device 4. Further, it may be also possible to set the rinse liquid to arrive at a position deviated from the center O of the wafer W. Even in such a case, however, it may be desirable to allow the rinse liquid to arrive at a position where the rinse liquid can be diffused to the center O of the wafer W by an arrival force of the rinse liquid on the wafer W, thus allowing a central region of the wafer W including the center O of the wafer W to be covered with a liquid film of the rinse liquid. In this case as well, a combination of the discharge flow rate of the rinse liquid and the height position of the outer nozzle 45 for achieving this target arrival position can be previously obtained through experiment.

The rinse liquid is discharged from the outer nozzle 45 by opening the opening/closing valve 48e and closing the opening/closing valve 48h, and then, the discharge of the rinse liquid from the outer nozzle 45 is stopped by closing the opening/closing valve 48e. Then, if the opening/closing valve 48h is opened, the rinse liquid existing in the outer nozzle 45, in a region of the rinse liquid supply line 48b downstream of the opening/closing valve 48e and in the drain line 48g is drained from the drain line 48g by a siphon effect. By emptying the outer nozzle 45 and the region of the rinse liquid supply line 48b downstream of the opening/closing valve 48e, the next time when the rinse liquid is discharged from the outer nozzle 45 by opening the opening/closing valve 48e, a flow velocity of the rinse liquid discharged from the outer nozzle 45 immediately after the beginning of the discharge is increased. Accordingly, the amount of the rinse liquid arriving at a position other than the center O of the wafer W immediately after the beginning of the discharge of the rinse liquid can be reduced.

Now, an example of a series of processes performed on each single sheet of wafer W by using the processing unit 16 of the above-described substrate processing system 1 will be explained.

[Carry-in of Wafer]

The wafer W is carried into the processing unit 16 by the substrate transfer device 17 and held by the substrate holding mechanism 30.

[Etching Process]

The substrate holding mechanism 30 starts to rotate the wafer W around the vertical axis. The rotation of the wafer W is continued until a drying process to be described later is ended. The first nozzle 41a of the first nozzle arm 42A is located at a position directly above a position P1 (see FIG. 3) on the wafer W distanced from the center O of the wafer W by a distance L1. The first nozzle 41a discharges an etching liquid (e.g., DHF (dilute hydrofluoric acid)) directly downwards. Accordingly, the etching liquid arrives at the position P1 which is distanced from the center O of the wafer W by the distance L1. The etching liquid having reached the position P1 is flown on the wafer W while being diffused toward a periphery of the wafer W by a centrifugal force. Further, the etching liquid having arrived at the position P1 is diffused up to the center O of the wafer W by the arrival force, and then is flown while being diffused toward the periphery of the wafer W by the centrifugal force. Accordingly, the entire surface of the wafer W is covered with the liquid film of the etching liquid. By maintaining this state for a preset time period, the surface of the wafer W is etched.

Further, the distance L1 is set to be a value which guarantees that the etching liquid having arrived at the position P1 is diffused up to the center O of the wafer W by the arrival force. By way of example, though varied depending on the discharge flow rate of the etching liquid, the distance L1 may be set to be 15 mm. By allowing the etching liquid to arrive not at the center O of the wafer W but at the position slightly deviated from the center O of the wafer W, the center O of the wafer W can be suppressed from being over-etched as compared to the other portion of the wafer W. That is, uniformity of the etching within the surface of the wafer W can be improved.

Then, while discharging the etching liquid from the first nozzle 41a, the first nozzle 41a is moved to the position directly above the center O of the wafer W.

[First Rinsing Process]

After the first nozzle 41a is moved to the position directly above the center O of the wafer W, the switching valve device 73 is immediately operated so that the liquid discharged from the first nozzle 41a is switched from the etching liquid to a rinse liquid (DIW). The rinse liquid discharged from the first nozzle 41a arrives at the center O of the wafer W and is flown on the wafer W while being diffused toward the periphery of the wafer W by the centrifugal force, so that the surface of the wafer W is covered with a liquid film of the rinse liquid. As a result, the etching liquid remaining on the wafer W and a reaction product generated through the etching process are washed away by the rinse liquid.

Subsequently, while discharging the rinse liquid from the first nozzle 41a, the first nozzle 41a is moved to a position directly above a position P2 near the center O of the wafer W. Specifically, the position P2 is distanced apart from the center O of the wafer W by a distance L2. At this time, the rinse liquid discharged from the first nozzle 41a arrives at the position P2 on the surface of the wafer W. The distance L2 is set to be a value which guarantees that the rinse liquid having arrived at the position P2 is diffused up to the center O of the wafer W by the arrival force. By way of example, though varied depending on the discharge flow rate of the rinse liquid, the distance L2 may be set to be 15 mm. The distance L2 and the position P2 may be the same as the distance L1 and the position P1, respectively.

Then, the rinse liquid (DIW) is discharged from the outer nozzle 45 so that the rinse liquid arrives at the center O of the wafer W. At this time, the rinse liquid is discharged from both the first nozzle 41a and the outer nozzle 45 simultaneously. For the convenience of the following explanation, this state will be referred to as "first simultaneous discharge state."

Thereafter, the discharge of the rinse liquid from the first nozzle 41a is stopped, and the first nozzle 41a is moved to the standby position (shown in FIG. 3). Then, the second nozzle 41c is located at a position directly above the position P2 distanced apart from the center O of the wafer W by the distance L2. At this time, the second nozzle 41c passes through a space above the center of the wafer W. While the second nozzle 41c is being moved, the second nozzle 41c does not interfere with a flow (trajectory) of the rinse liquid being discharged from the outer nozzle toward the center of the wafer W.

Next, the rinse liquid is discharged from the second nozzle 41c. The second nozzle 41c discharges the rinse liquid directly downwards. Accordingly, the rinse liquid discharged from the second nozzle 41c arrives at the position P2 on the surface of the wafer W. At this time, the rinse liquid is discharged from both the second nozzle 41c and the outer nozzle 45 simultaneously. For the convenience of the following explanation, this state will be referred to as "second simultaneous discharge state."

Thereafter, the discharge of the rinse liquid from the outer nozzle 45 is stopped, and the second nozzle 41c is moved to the position directly above the center O of the wafer W while continuing to discharge the rinse liquid from the second nozzle 41c.

As stated above, by using the outer nozzle 45, it is possible to perform the switchover of the nozzle arms 42A and 42B, that is, the switchover of the first nozzle 41a and the second nozzle 41c while maintaining the state where the entire surface of the wafer W is covered with the rinse liquid.

[Chemical Liquid Cleaning Process]

After the second nozzle 41c is moved to the position directly above the center O of the wafer W, the switching valve device 76 is operated so that the liquid discharged from the second nozzle 41c is switched from the rinse liquid (DIW) to a cleaning liquid (a chemical liquid for cleaning, e.g., SC-1). The cleaning liquid discharged from the second nozzle 41c arrives at the center O of the wafer W and is flown on the wafer W while being diffused toward the periphery thereof by the centrifugal force, so that the surface of the wafer W is covered with a liquid film of the cleaning liquid. As a result, an organic contaminant existing on the wafer W is washed away by the cleaning liquid.

[Second Rinsing Process]

Thereafter, the liquid discharged from the second nozzle 41c is changed from the cleaning liquid to the rinse liquid.

The rinse liquid discharged from the second nozzle 41c arrives at the center O of the wafer W and is flown on the wafer W while being diffused toward the periphery of the wafer W by the centrifugal force, so that the surface of the wafer W is covered with a liquid film of the rinse liquid. As a result, the cleaning liquid remaining on the wafer W and a reaction product generated through the cleaning process are washed away by the rinse liquid.

[Solvent Replacing Process]

While continuing the discharge of the rinse liquid from the second nozzle 41c, IPA is discharged from the solvent nozzle 41d, and while maintaining this state, the solvent nozzle 41d is moved to the position directly above the center O of the wafer W. Then, the discharge of the rinse liquid from the second nozzle 41c is stopped. The IPA discharged from the solvent nozzle 41d falls down onto the center O of the wafer W and is flown on the wafer W while being diffused toward the periphery of the wafer W by the centrifugal force. As a result, the rinse liquid (DIW) on the surface of the wafer W is replaced by the IPA, and the surface of the wafer W is covered with a liquid film of the IPA.

[Drying Process]

While the solvent nozzle 41d is discharging the IPA to the center O of the wafer W, the drying gas nozzle 41b is moved to above a position near the center O of the wafer W within a range where the nozzle arms 42A and 42B do not collide with each other. Then, the solvent nozzle 41d is moved toward the periphery of the wafer W. If the solvent nozzle 41d is retreated from above the center O of the wafer W, the drying gas nozzle 41b is moved to directly above the center O of the wafer W, and a drying gas (e.g., a nitrogen gas, dry air, or the like) is discharged from the drying gas nozzle 41b. The drying gas nozzle 41b is then moved toward the periphery of the wafer W. At this time, the solvent nozzle 41d and the drying gas nozzle 41b are moved toward the periphery of the wafer W while maintaining the positional relationship that the solvent nozzle 41d is located at an outer position than the drying gas nozzle 41b in the radial direction of the wafer W. Accordingly, a circular drying region is enlarged from the central portion of the wafer W toward the periphery thereof, and, finally, the entire surface of the wafer W is dried.

Through the above-described operations, the series of processes upon the single sheet of wafer W are ended. The completely processed wafer W is carried out of the processing unit 16 by the substrate transfer device 17.

When performing the above-described processes, there might be assumed a case where a device, which is vulnerable to electrification, is previously formed on the wafer W as the target of the processing. In this case, to suppress triboelectrification, the flow rate of the rinse liquid is required to be small. Meanwhile, when processing a wafer which does not have such a requirement, it may be desirable to set the flow rate of the rinse liquid to be large to shorten a processing time. By adding the automatic elevating function to the outer nozzle 45 as stated above, the height position of the outer nozzle 45 can be changed in response to the variation in the flow rate of the rinse liquid. Thus, the arrival position of the rinse liquid can be allowed to be set at the center of the wafer W regardless of the flow rate of the rinse liquid. Therefore, even if the discharge flow rate of the rinse liquid as a process parameter is differed between a preceding processing lot and a following processing lot, it is not needed to stop the overall operations of the substrate processing system 1 or to open a panel of the processing unit 16 for the manual adjustment. Hence, the substrate processing system 1 can be run effectively.

Figure 5:
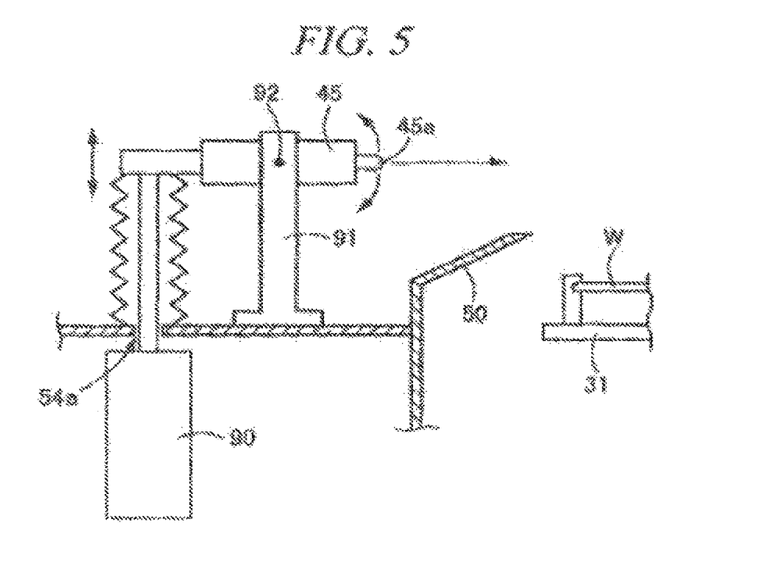
FIG. 5 is a schematic diagram illustrating another configuration of the outer nozzle and the processing liquid supply mechanism and the elevating mechanism corresponding thereto.

Furthermore, in the above-described exemplary embodiment, the height position of the outer nozzle 45 can be adjusted by the elevating mechanism 46 which is the linear actuator. However, the exemplary embodiment is not limited thereto, and, the discharge angle of the outer nozzle 45 may be adjusted by an actuator 90, for example, a ball screw operated by an electric rotating motor, as shown in FIG. 5. In the example shown in FIG. 5, a supporting column 91 is provided on the bottom plate 54, and the outer nozzle 45 is rotatably supported on the supporting column 91 via a horizontal shaft 92 provided at the supporting column 91. As the actuator 90 pushes (pulls) an appropriate portion of the outer nozzle 45 (in FIG. 5, a rear end portion of the outer nozzle 45) which is distanced apart from the horizontal shaft 92, the discharge angle (ascending angle or descending angle) of the outer nozzle 45 is changed. Accordingly, the discharge angle of the rinse liquid discharged from the outer nozzle 45 is changed, so that the arrival position of the rinse liquid onto the wafer W can be changed. In the example shown in FIG. 5 as well, the position of the outer nozzle 45 in the horizontal direction is maintained constant.

Now, there will be explained an experiment which is conducted to investigate a desirable arrival position of the rinse liquid discharged from the first nozzle 41a (or the second nozzle 41c) onto the surface of the wafer W to suppress splash of the liquid in the aforementioned first and second simultaneous discharge states. Since the first simultaneous discharge state and the second simultaneous discharge state are substantially same, the experiment is performed only for the first simultaneous discharge state. As stated earlier, since the arrival position of the rinse liquid from the outer nozzle 45 is required to be the center O of the wafer W, the arrival position of the rinse liquid discharged from the first nozzle 41a is changed in the experiment. To achieve various positions of the first nozzle 41a to be described below, a nozzle arm dedicated for testing is used as the nozzle arm holding the first nozzle 41a.

Figure 6:
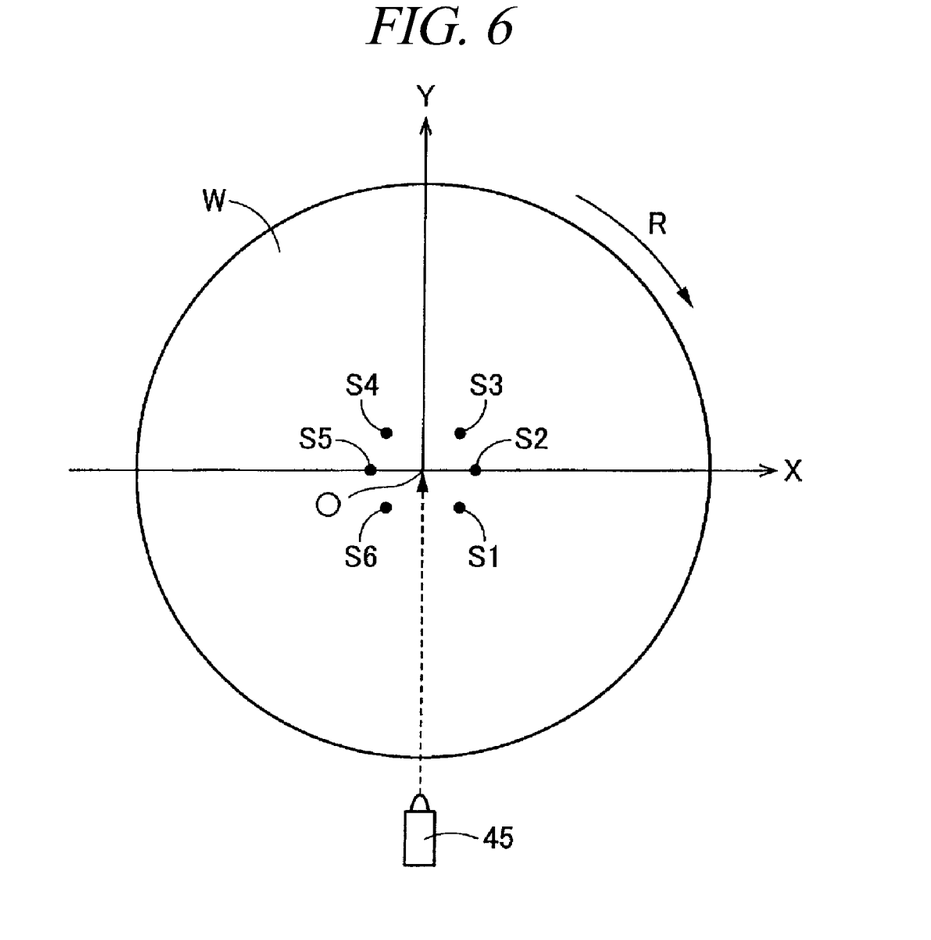
FIG. 6 is a diagram for describing an experiment in which a processing liquid is discharged from the outer nozzle and a first nozzle at the same time.

To describe the arrival positions, an XY orthogonal coordinate system is set on the surface of the wafer W as shown in FIG. 6 which is a plan view of the wafer W being rotated when viewed from directly above. The center (rotation center) O of the wafer W is called an origin (hereinafter, sometimes referred to as "origin O") of the XY orthogonal coordinate system. A flight trajectory of the rinse liquid reaching the origin O after being discharged from the outer nozzle 45 is indicated by a thick dashed line. A straight line including the flight trajectory of the rinse liquid is defined as the Y-axis, and the direction of the flight of the rinse liquid is defined as the positive Y-axis direction. A straight line including a second vector obtained by rotating a first vector, which is started from the origin O and oriented toward the positive Y-axis direction, by 90 degrees in a rotational direction R of the wafer W around the origin O is defined as the X-axis. The positive X-axis direction coincides with the direction of the second vector. That is, in FIG. 6, since the rotational direction of the wafer W is clockwise, the upward direction of FIG. 6 becomes the positive Y-axis direction, and the rightward direction of FIG. 6 becomes the positive X-axis direction. Further, if the rotational direction of the wafer W is counterclockwise, the leftward direction of FIG. 6 becomes the positive X-axis direction. Further, the X-axis and the Y-axis of the XY orthogonal coordinate system shown in FIG. 6 may coincide with the X-axis and the Y-axis shown in FIG. 1 (as in the processing units 16 shown in the lower part of FIG. 1) or may not.

Splashes that occur when the horizontal position of the first nozzle 41a, that is, the arrival position of the rinse liquid discharged from the first nozzle 41a is set to positions S1, S2, S3, S4, S5 and S6 shown in FIG. 6 are investigated. Distances from the origin O as the rotation center of the wafer W to the respective positions S1 to S6 are all 15 mm, and only angular positions are different. S2 and S5 are positions on the X-axis; S3, a position 45 degrees behind the position S2 in the rotational direction R of the wafer; S1, a position rotated 45 degrees from the position S2 in the rotational direction R of the wafer; S6, a position 45 degrees behind the position S5 in the rotational direction R of the wafer W; and S4, a position rotated 45 degrees from the position S5 in the rotational direction R of the wafer.

Experiment conditions are as follows. The rotational speed of the wafer W is set to be 1500 rpm; the discharge flow rate of the rinse liquid from the outer nozzle, 1.5 L/min; and the discharge flow rate of the rinse liquid from the first nozzle 41a is set to have three levels of 0.5 L/min, 1.0 L/min and 1.5 L/min. Presence or absence of splashes and occurrence situation thereof are determined based on a high-speed video and high-resolution still images. Experiment results are shown in the following table.

TABLE 1

| Flow rate (L/min) | S1 | S2 | S3 | S4 | S5 | S6 |
|---|---|---|---|---|---|---|
| 0.5 | O | O | X | X | Δ | Δ |
| 1.0 | O | Δ | X | X | X | Δ |
| 1.5 | O | X | X | X | X | X |

In the above Table 1, a symbol "O" implies that no splash has occurred; a symbol "Δ" implies that a splash has occurred on rare occasions; and a symbol "X" indicates that a splash has occurred all the time.

As a result of observing the images, on the positions S2 and S3, splashes are found to occur when the liquid discharged from the first nozzle 41a falls down on the liquid film of the rinse liquid which is discharged from the outer nozzle 45 to be diffused on the wafer W after reaching the wafer W ((except when the flow rate is 0.5 L/min). Meanwhile, on the positions S4, S5 and S6, splashes are found to occur when the liquid discharged from the outer nozzle 45 falls down on the liquid film of the rinse liquid which is discharged from the first nozzle 41a to be diffused on the wafer W after reaching the wafer W.

On the position S1, any of the aforementioned splashes has not occurred regardless of the discharge flow rate from the first nozzle 41a. In view of this result, it is found out that the splashes can be suppressed from occurring by setting the arrival position of the rinse liquid from the first nozzle 41a to be a fourth quadrant (that is, X>0, Y<0) on the aforementioned XY orthogonal coordinate system.

As can be seen from this experiment result, it is desirable that the position P1 of the first nozzle 41a and the position P2 of the second nozzle 41c in the aforementioned first and second simultaneous discharge states in the exemplary embodiment are set to be the position S1 as mentioned in the above-described experiment.

In the above-described exemplary embodiment, when performing the series of processes on the wafer W, the outer nozzle 45 and the movable nozzles 41a to 41d provided at the nozzle arms 42A and 42B are used together. However, the exemplary embodiment is not limited thereto. By way of example, all of the processing liquids supplied to the wafer W may be supplied from a single or a plurality of outer nozzles.

The rinse liquid is not limited to the pure water (DIW). To add conductivity, a solution prepared by dissolving a small amount of carbon dioxide gas and/or ammonia in DIW may be used.

The processing liquid discharged from the outer nozzle 45 is not be limited to the rinse liquid but any of various other kinds of processing liquids such as an acidic chemical liquid, an alkaline chemical liquid and an organic solvent may be discharged from the outer nozzle 45.

In case of supplying the chemical liquid from the outer nozzle 45, it may be considered, for the purpose of saving the chemical liquid, to supply the chemical liquid to the center of the wafer W at a relatively large flow rate at first to form a liquid film of the chemical liquid rapidly on the entire surface of the wafer W and then to supply the chemical liquid to the center of the wafer W at a relatively small flow rate only to the extent that the liquid film of the chemical liquid can be maintained. In this case as well, by lowering the height position of the outer nozzle 45 when discharging the chemical liquid from the outer nozzle 45 at the relatively large flow rate and by raising the height position of the outer nozzle 45 when discharging the chemical liquid from the outer nozzle 45 at the relatively small flow rate, the arrival position of the chemical liquid can be set to be the center of the wafer W regardless of the discharge flow rate of the chemical liquid.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A substrate liquid processing apparatus, comprising:
a substrate holding unit configured to hold a substrate;
an outer nozzle configured to discharge a processing liquid toward a surface of the substrate from a position at an outside of an outer edge of the substrate held by the substrate holding unit such that at least a central portion of the surface of the substrate is covered with a liquid film of the discharged processing liquid;
an actuator configured to change a height position or a discharge angle of the outer nozzle; and
a rotational driving unit configured to rotate the substrate around a vertical axis by rotating the substrate holding unit;
a movable nozzle configured to discharge the processing liquid downwards from above the substrate;
a nozzle arm configured to support the movable nozzle and move the movable nozzle between a position above the substrate held by the substrate holding unit and a position at an outside of the outer edge of the substrate; and
a control unit configured to control the movable nozzle to discharge the processing liquid onto a preset position on the substrate and control the outer nozzle to discharge the processing liquid onto a center of the substrate at the same time,
wherein the preset position is near the center of the substrate, and is located, when viewed from directly above the substrate being rotated, within a fourth quadrant of an XY orthogonal coordinate system in which a straight line including a flight trajectory of the processing liquid discharged from the outer nozzle is defined as an Y-axis, a flight direction of the processing liquid is defined as a positive Y-axis direction, a straight line including a second vector obtained by rotating a first vector, which is started from a rotation center of the substrate and faces toward the positive Y-axis direction, by 90 degrees in a rotational direction of the substrate with respect to the rotation center of the substrate is defined as an X-axis, and a direction of the second vector is defined as a positive X-axis direction.

2. The substrate liquid processing apparatus of claim 1, further comprising:
   a flow rate control valve configured to adjust a flow rate of the processing liquid discharged from the outer nozzle; and
   a control unit configured to control the actuator to adjust the height position or the discharge angle of the outer nozzle based on the flow rate of the processing liquid discharged from the outer nozzle.

3. The substrate liquid processing apparatus of claim 2, wherein the control unit adjusts the height position or the discharge angle of the outer nozzle based on a previously obtained relationship in which the flow rate of the processing liquid discharged from the outer nozzle, the height position of the outer nozzle and an arrival position of the processing liquid discharged from the outer nozzle onto the substrate are related.

4. The substrate liquid processing apparatus of claim 2, wherein the outer nozzle is provided such that a relative position of the outer nozzle with respect to the substrate holding unit is not changed when viewed from a top.

5. The substrate liquid processing apparatus of claim 2, wherein, after discharging the processing liquid from the outer nozzle to allow the central portion of the surface of the substrate to be covered with the liquid film of the processing liquid, the control unit reduces the flow rate of the processing liquid discharged from the outer nozzle by controlling the flow rate control valve and raises the height position of the outer nozzle by controlling the actuator.

* * * * *